(12) United States Patent
Park et al.

(10) Patent No.: US 9,978,523 B1
(45) Date of Patent: May 22, 2018

(54) MULTILAYER CAPACITOR AND BOARD HAVING THE MULTILAYER CAPACITOR MOUNTED THEREON

(71) Applicant: SAMSUNG ELECTRO-MECHANICS CO., LTD., Suwon-si, Gyeonggi-do (KR)

(72) Inventors: Heung Kil Park, Suwon-si (KR); Jong Hwan Park, Suwon-si (KR); Se Hun Park, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days. days.

(21) Appl. No.: 15/651,703

(22) Filed: Jul. 17, 2017

(30) Foreign Application Priority Data

Dec. 22, 2016 (KR) .......................... 10-2016-0177112

(51) Int. Cl.
| | |
|---|---|
| *H01G 4/30* | (2006.01) |
| *H01G 4/005* | (2006.01) |
| *H01G 4/12* | (2006.01) |
| *H01G 4/248* | (2006.01) |
| *H05K 1/18* | (2006.01) |

(52) U.S. Cl.
CPC .............. *H01G 4/30* (2013.01); *H01G 4/005* (2013.01); *H01G 4/12* (2013.01); *H01G 4/248* (2013.01); *H05K 1/181* (2013.01); *H05K 2201/10015* (2013.01)

(58) Field of Classification Search
CPC ........... H01G 4/30; H01G 4/005; H01G 4/12; H01G 4/248; H05K 1/181
USPC ....................................................... 174/260
See application file for complete search history.

(56) References Cited

U.S. PATENT DOCUMENTS

| | | | | |
|---|---|---|---|---|
| 2014/0345926 A1* | 11/2014 | Lee | .......................... | H01G 4/30 174/260 |
| 2015/0022945 A1 | 1/2015 | Park et al. | | |

(Continued)

FOREIGN PATENT DOCUMENTS

| | | |
|---|---|---|
| JP | 2000-306765 A | 11/2000 |
| JP | 2014-027085 A | 2/2014 |

(Continued)

*Primary Examiner* — Timothy Thompson
*Assistant Examiner* — Charles Pizzuto
(74) *Attorney, Agent, or Firm* — McDermott Will & Emery LLP

(57) ABSTRACT

A multilayer capacitor includes a capacitor body including a dielectric layer and a plurality of first and second internal electrodes, the capacitor body having a first surface and a second surface opposing each other, the capacitor body having a third surface and a fourth surface connected to the first surface and the second surface and opposing each other, and first and second band portions extended from the first and second connection portions to portions of the first surface and the second surface of the capacitor body and portions of a fifth surface and a sixth surface of the capacitor body, respectively, an insulating layer covering the first and second band portions, and a first terminal electrode and a second terminal electrode covering the first and second external electrodes, and portions of the insulating layer disposed on the first surface of the capacitor body and spaced apart from each other.

8 Claims, 11 Drawing Sheets

(56) References Cited

U.S. PATENT DOCUMENTS

2015/0084487 A1\* 3/2015 Mori .................. H01L 41/0472
 310/364
2016/0049257 A1\* 2/2016 Shirakawa ............... H01G 4/30
 361/301.4

FOREIGN PATENT DOCUMENTS

| JP | 2014-036149 A | 2/2014 |
| KR | 10-1434108 B1 | 8/2014 |

\* cited by examiner

US 9,978,523 B1

MULTILAYER CAPACITOR AND BOARD HAVING THE MULTILAYER CAPACITOR MOUNTED THEREON

CROSS-REFERENCE TO RELATED APPLICATION(S)

This application claims the benefit of priority to Korean Patent Application No. 10-2016-0177112, filed on Dec. 22, 2016 with the Korean Intellectual Property Office, the disclosure of which is incorporated herein by reference in its entirety.

TECHNICAL FIELD

The present disclosure relates to a multilayer capacitor and a board having the multilayer capacitor mounted thereon.

BACKGROUND

Multilayer ceramic capacitors, multilayer chip electronic components, are chip-type condensers installed on printed circuit boards of various electronic products, for example, image display devices such as liquid crystal displays (LCDs), plasma display panels (PDPs) or the like, computers, personal digital assistants (PDAs), mobile phones, and the like, to charge or discharge electricity.

Such multilayer ceramic capacitors (MLCCs), having positive attributes such as compactness, guaranteed high capacitance, and ease in the mounting thereof may be used as components in various electronic devices.

Such an MLCC may have a structure in which a plurality of dielectric layers and internal electrodes are alternately disposed in such a manner that the internal electrodes having different polarities are provided between the dielectric layers.

The dielectric layers have piezoelectric and electrostrictive properties. Thus, when a direct current (DC) or alternating current (AC) voltage is applied to an MLCC, a piezoelectric phenomenon may occur between internal electrodes, thereby causing the occurrence of vibrations.

Vibrations may be transferred to boards on which MLCCs are mounted, through external electrodes of the MLCCs, leading to the entirety of the boards acting as acoustically radiating surfaces to generate vibratory sound as noise.

Vibratory sound may correspond to audio frequencies ranging from 20 Hz to 20,000 Hz, causing listener discomfort, and such a vibratory sound, which may cause listener discomfort, is commonly known as acoustic noise.

As low noise designs of electronic products have come to prominence, acoustic noise generated in MLCCs has become an issue. In particular, reductions of acoustic noise in electronic products having a voice communications function, such as smartphones, have been desirable, researched and required.

SUMMARY

An aspect of the present disclosure is to provide a multilayer capacitor in which acoustic noise may be reduced by decreasing piezoelectric vibrations, and a board having the same mounted thereon.

According to an aspect of the present disclosure, a multilayer capacitor includes a capacitor body including a dielectric layer and a plurality of first and second internal electrodes alternately disposed therein, having the dielectric layer interposed therebetween, and having a first surface and a second surface opposing each other, a third surface and a fourth surface connected to the first surface and the second surface and opposing each other, and a fifth surface and a sixth surface connected to the first surface and the second surface, connected to the third surface and the fourth surface, and opposing each other, the plurality of first and second internal electrodes being exposed through the third surface and the fourth surface, respectively; a first external electrode and a second external electrode including first and second connection portions disposed on the third surface and the fourth surface of the capacitor body, and first and second band portions extended from the first and second connection portions to portions of the first surface and the second surface of the capacitor body and portions of the fifth surface and the sixth surface of the capacitor body, respectively; an insulating layer disposed to cover the first and second band portions on the first surface of the capacitor body and to cover portions of the first and second connection portions; and a first terminal electrode and a second terminal electrode disposed to cover the first and second external electrodes, and portions of the insulating layer disposed on the first surface of the capacitor body, and spaced apart from each other.

According to an aspect of the present disclosure, a board having a multilayer capacitor mounted thereon includes a substrate on which first and second electrode pads are disposed to be spaced apart from each other; and the multilayer capacitor described above, of which first and second terminal electrodes are connected to the first and second electrode pads, respectively, the multilayer capacitor being mounted on the substrate.

BRIEF DESCRIPTION OF DRAWINGS

The above and other aspects, features, and advantages of the present disclosure will be more clearly understood from the following detailed description when taken in conjunction with the accompanying drawings, in which.

DETAILED DESCRIPTION

Figure 1:
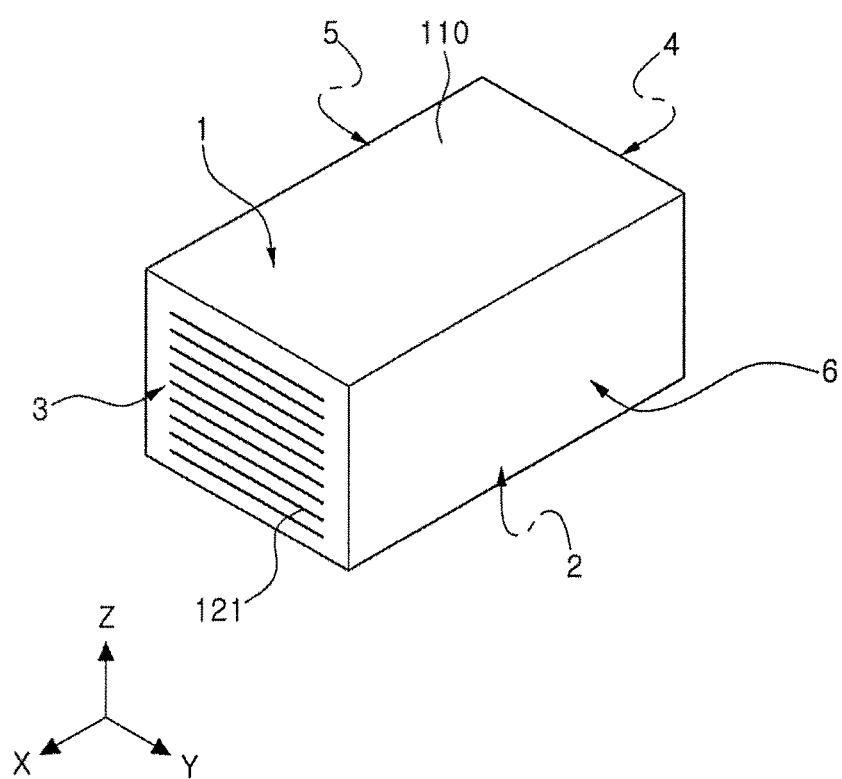
FIG. 1 is a perspective view illustrating a capacitor body of a multilayer capacitor according to a first embodiment of the present disclosure.

Hereinafter, exemplary embodiments of the present disclosure will be described as follows with reference to the attached drawings.

The present disclosure may, however, be exemplified in many different forms and should not be construed as being limited to the specific embodiments set forth herein. Rather, these exemplary embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be construed as being limited by these terms. These terms are only used to distinguish one member, component, region, layer or section from another region, layer or section. Thus, a first member, component, region, layer or section discussed below could be termed a second member, component, region, layer or section without departing from the teachings of the embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of an exemplary device in use or operation in addition to the orientation depicted in the figures. For example, if the device in the figures is turned over, elements described as "above," or "upper" other elements would then be oriented "below," or "lower" the other elements or features. Thus, the term "above" can encompass both upward and downward orientations, depending on a particular direction of the figures. The device may be otherwise oriented (rotated 90 degrees or at other orientations) and the spatially relative descriptors used herein may be interpreted accordingly.

The terminology used herein describes particular exemplary embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members elements and/or groups thereof.

Hereinafter, exemplary embodiments of the present disclosure will be described with reference to views illustrating embodiments of the present disclosure. In the drawings, for example, due to manufacturing techniques and/or tolerances, modifications of the shape shown may be estimated. Thus, exemplary embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

For example, when the direction of a capacitor body is defined to clearly illustrate exemplary embodiments in the present disclosure, X, Y and Z illustrated in the drawings represent a length direction, a width direction, and a thickness direction, respectively.

In the exemplary embodiments, for convenience of explanation, two surfaces of a capacitor body 110 of a multilayer capacitor, opposing each other in a Z direction, are set to be first and second surfaces 1 and 2; two surfaces thereof connecting edges of the first and second surfaces 1 and 2 to each other while opposing each other in an X direction are set to be third and fourth surfaces 3 and 4; and two surfaces thereof, connecting edges of the first and second surfaces 1 and 2 and edges of the third surface and the fourth surface 3 and 4 to each other, respectively, while opposing each other in a Y direction, are set to be fifth and sixth surfaces 5 and 6, which will be described below. In this case, the first surface 1 may be used as a mounting surface.

Multilayer Capacitor

Figure 2:
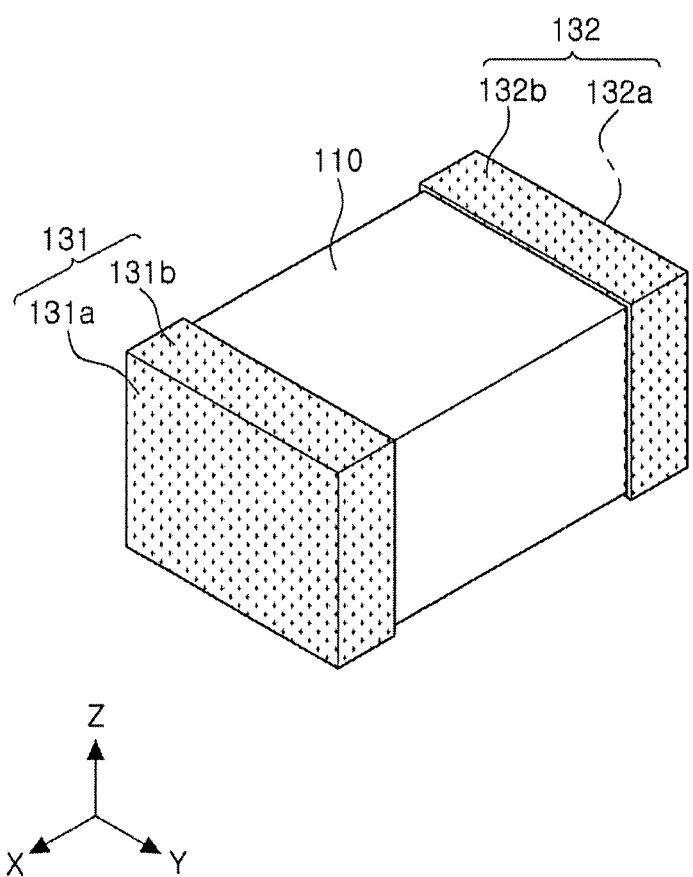
FIG. 2 is a perspective view illustrating first and second external electrodes disposed on a capacitor body of a multilayer capacitor according to the first embodiment of the present disclosure.
Figure 3:
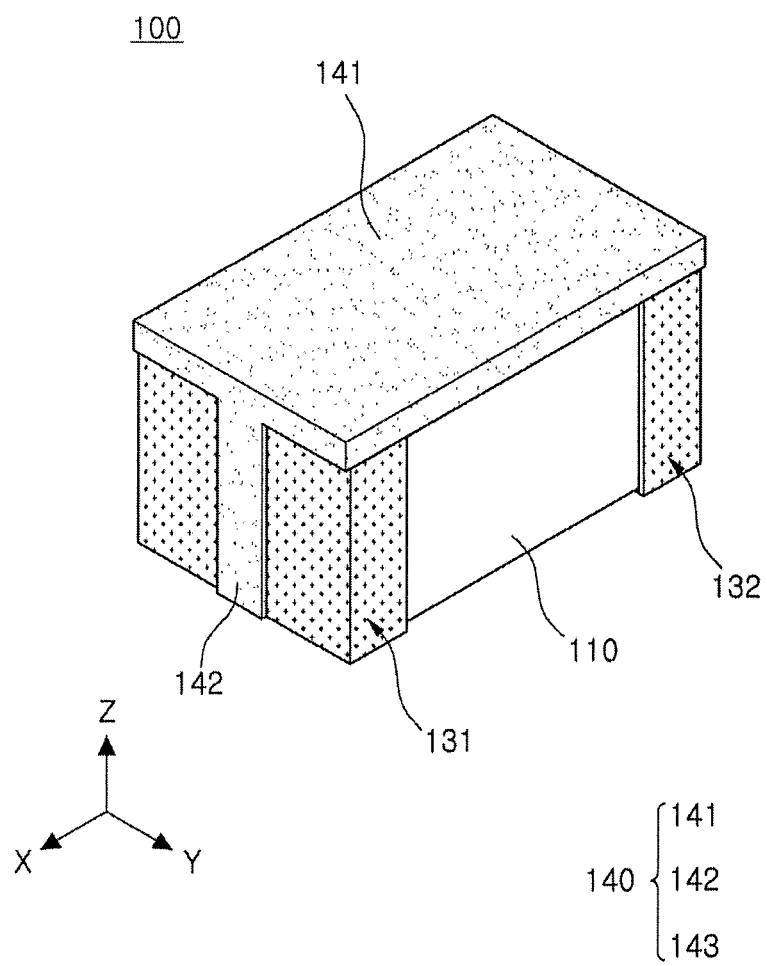
FIG. 3 is a perspective view illustrating an insulating layer further disposed in the multilayer capacitor of FIG. 2.
Figure 4:
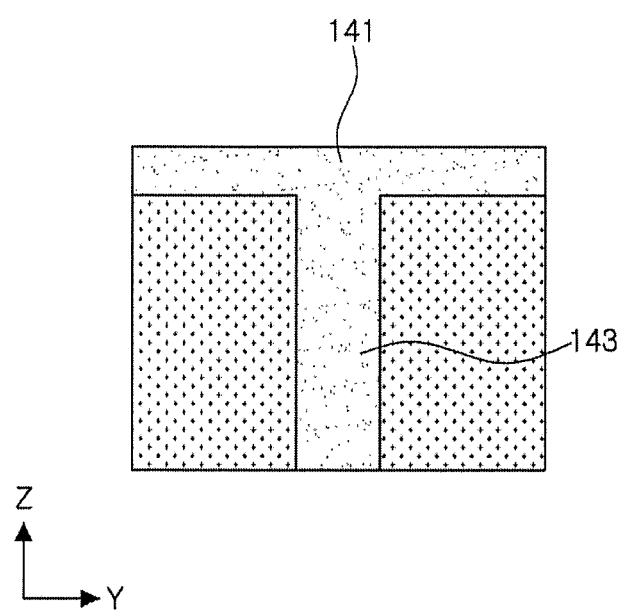
FIG. 4 is a side view of FIG. 3 when viewed from one side in an X direction.
Figure 5:
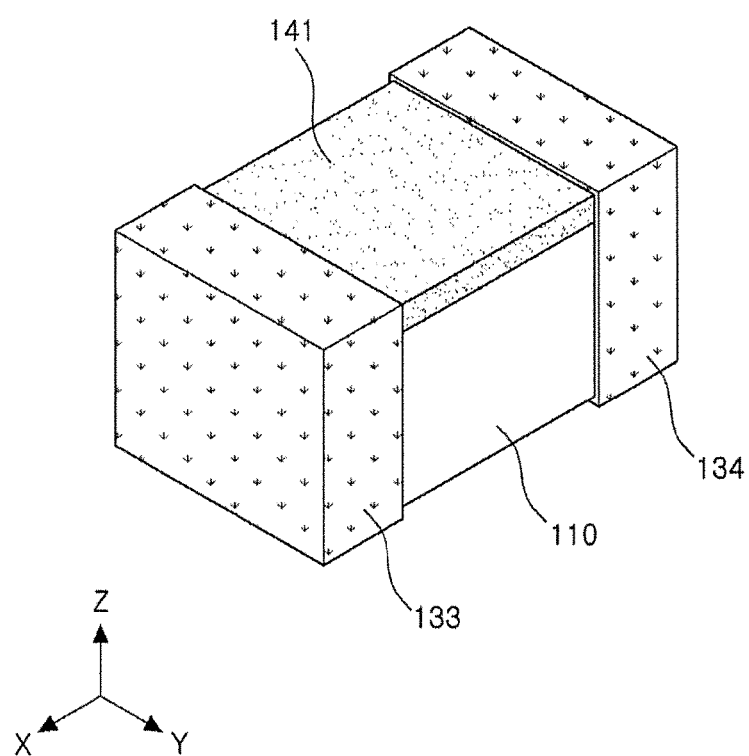
FIG. 5 is a perspective view illustrating first and second terminal electrodes further disposed in the insulating layer of FIG. 3.
Figure 6:
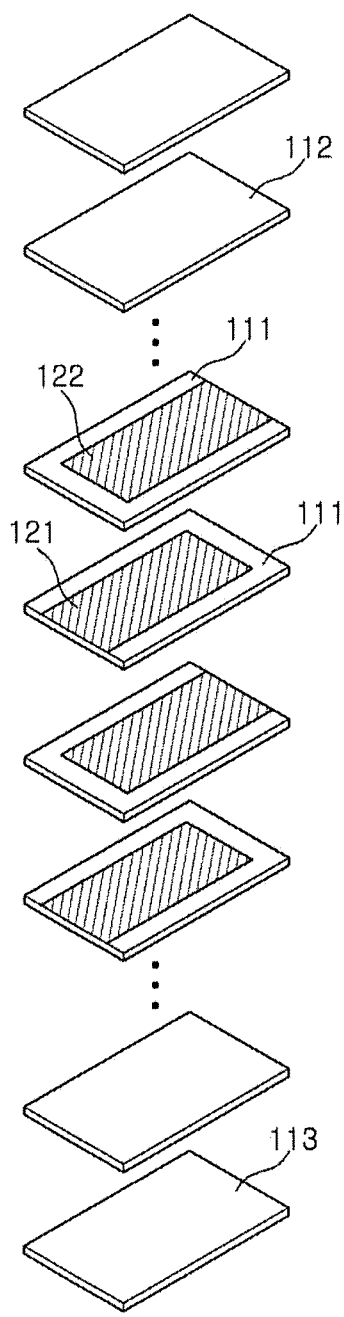
FIG. 6 is a perspective view illustrating first and second internal electrodes in a multilayer capacitor according to the first embodiment in the present disclosure.

FIG. 1 is a perspective view illustrating a capacitor body of a multilayer capacitor according to a first exemplary embodiment. FIG. 2 is a perspective view illustrating first and second external electrodes disposed on a capacitor body of a multilayer capacitor according to the first embodiment. FIG. 3 is a perspective view illustrating an insulating layer further disposed in the capacitor body of FIG. 2. FIG. 4 is a side view of FIG. 3 when viewed from one side in an X direction. FIG. 5 is a perspective view illustrating first and second terminal electrodes further disposed in the capacitor body of FIG. 3. FIG. 6 is a perspective view illustrating first and second internal electrodes in a multilayer capacitor according to the first embodiment.

With reference to FIGS. 1 to 6, a multilayer capacitor 100 according to a first embodiment may include a capacitor body 110 including a dielectric layer 111 and a plurality of first and second internal electrodes 121 and 122, first and second external electrodes 131 and 132, an insulating layer 140, and first and second terminal electrodes 133 and 134.

The capacitor body 110 may be formed by laminating a plurality of dielectric layers 111 in a Z direction, a direction perpendicular to the first surface 1, and although not particularly limited, the capacitor body 110 may have a substantially hexahedral shape as illustrated in the drawings.

In this case, a shape and dimensions of the capacitor body 110 and the number of laminated layers of the dielectric layers 111 are not limited to those illustrated in the drawings.

In addition, the dielectric layer 111 may be in a sintered state. In this case, adjacent dielectric layers 111 may be integrated, such that it may be difficult to confirm boundaries therebetween without using a scanning electron microscope (SEM).

The capacitor body 110 may include an active region including the first and second internal electrodes 121 and 122, serving as a portion contributing to capacitance formation of a capacitor, and cover regions disposed on two sides of the active region as margin portions, respectively, in a Z direction.

The active region may be formed by repeatedly laminating a plurality of the first and second internal electrodes 121 and 122 to have the dielectric layer 111 interposed therebetween.

In this case, a thickness of the dielectric layer 111 may be arbitrarily changed according to a capacitance design of the multilayer capacitor 100.

The dielectric layer 111 may include a ceramic powder having a high dielectric constant, for example, a barium titanate ($BaTiO_3$)-based or strontium titanate ($SrTiO_3$)-based powder, and an exemplary embodiment in the present disclosure is not limited thereto.

In addition, one or more of a ceramic additive, an organic solvent, a plasticizer, a binder and a dispersing agent may be added to the dielectric layer 111 as required, together with the ceramic powder.

The cover regions may be located outermost within the capacitor body 110 in the Z direction, respectively, and may have the same material and configuration as those of the dielectric layer 111, except that the cover regions do not include an internal electrode.

The cover regions may be provided by laminating single dielectric layers 112 and 113, or two or more dielectric layers 112 and 113, on two sides of the active region in the Z direction, respectively. The cover regions may prevent the first and second internal electrodes 121 and 122 from being damaged due to physical or chemical stresses.

The first and second internal electrodes 121 and 122 may be electrodes having different polarities.

The first and second internal electrodes 121 and 122 may be alternately disposed in the capacitor body 110 in the Z direction, to have the dielectric layer 111 interposed therebetween. An area of an overlap region of the first and second internal electrodes 121 and 122 in the Z direction may be relevant to the capacitance formation of the capacitor.

The first and second internal electrodes 121 and 122 may be formed by printing a conductive paste containing a conductive metal to a predetermined thickness on the dielectric layer 111, and may be electrically insulated by the dielectric layer 111 disposed therebetween.

The conductive metal included in the conductive paste may be, for example, nickel (Ni), copper (Cu), palladium (Pd) or alloys thereof, but an exemplary embodiments of the present disclosure are not limited thereto.

The conductive paste may be printed by a screen printing method, a gravure printing method, or the like, but exemplary embodiments of the present disclosure are not limited thereto.

One end of the first internal electrode 121 in an X direction may be exposed through the third surface 3 of the capacity body 110, and one end of the second internal electrode 122 in the X direction may be exposed through the fourth surface 4 of the capacity body 110.

However, a lead-out structure thereof is not limited thereto. For example, the lead-out structure of the internal electrodes may be variously changed.

The first and second external electrodes 131 and 132 may be formed using a conductive paste containing a conductive metal and glass.

The conductive metal may be nickel (Ni), copper (Cu), palladium (Pd), gold (Au) or alloys thereof, but exemplary embodiments of the present disclosure are not limited thereto.

In this case, the first and second external electrodes 131 and 132 may include first and second connection portions 131a and 132a formed on the third and fourth surfaces 3 and 4 of the capacitor body 110 to be connected to exposed ends of the first and second internal electrodes 121 and 122, and first and second band portions 131b and 132b extended from the first and second connection portions 131a and 132a to portions of the first and second surfaces 1 and 2 of the capacitor body 110 and portions of the fifth and sixth surfaces 5 and 6 of the capacitor body 110, respectively.

The insulating layer 140 may be formed to cover the first and second band portions 131b and 132b on the first surface of the capacitor body 110 and to cover portions of the first and second connection portions 131a and 132a.

In this case, the insulating layer 140 may be formed of a thermosetting resin such as an epoxy, but exemplary embodiments of the present disclosure are not limited thereto.

In the exemplary embodiments, the insulating layer 140 may include a horizontal portion 141, a first vertical portion 142 disposed to cover a portion of the first connection portion 131a on the third surface 3 of the capacitor body 110, and a second vertical portion 143 disposed to cover a portion of the second connection portion 132a on the fourth surface 4 of the capacitor body 110.

The horizontal portion 141 may be disposed to cover the first and second band portions 131b and 132b on the first surface 1 of the capacitor body 110.

In this case, the horizontal portion 141 may be formed on the entirety of the first surface 1 of the capacitor body 110.

The first vertical portion 142 may be formed lengthwise in a Z direction, a direction from an edge of the horizontal portion 141 to an edge of the second surface 2 of the capacitor body 110, to be located on a middle portion of the first connection portion 131a in a Y direction in such a manner that exposed portions may be provided on both sides of the vertical portion in the Y direction 142 to thus expose portions of the first connection portion 131a.

The second vertical portion 143 may be formed lengthwise in the Z direction, a direction from an edge of the horizontal portion 141 to an edge of the second surface 2 of the capacitor body 110, to be located on a middle portion of the second connection portion 132a in a Y direction in such a manner that exposed portions may be provided on both sides of the vertical portion 143 in the Y direction to thus expose portions of the second connection portion 132a.

For example, when the multilayer capacitor 100 is mounted on a substrate, the insulating layer 140 may absorb mechanical stresses caused by deformation, thermal expansion or the like of the substrate to prevent damage to the capacitor body 110, and may absorb piezoelectric vibrations of the capacitor body 110 to reduce acoustic noise, by elastic force thereof.

In this case, since the insulating layer 140 may prevent the first and second external electrodes 131 and 132 from being delaminated from the capacitor body 110, a stable acoustic noise reduction effect may be expected in terms of long term stability.

The first and second vertical portions 142 and 143 may block moisture penetrating through pin-holes of the first and second terminal electrodes 133 and 134 to improve moisture resistance and thus prevent deteriorations of reliability.

Further, for example, when areas of the first and second vertical portions are smaller than areas of the first and second connection portions to increase exposed areas of the first and second external electrodes as in the exemplary embodiments, an area of a contact region in which the first and second external electrodes and the first and second terminal electrodes are in direct contact with each other, respectively, may be increased.

Thus, contact resistance between the external electrode and the terminal electrode may be reduced, and thus, an increase in equivalent series resistance (ESR) of the multilayer capacitor may be prevented.

The first and second terminal electrodes 133 and 134 may be formed of a conductive resin including a conductive metal and a resin as fillers. In this case, the resin may be a thermosetting resin.

Thus, the first and second terminal electrodes may further reduce acoustic noise by additionally suppressing piezoelectric vibrations of the capacitor body 110.

The first terminal electrode 133 may be disposed to cover externally exposed portions of the first external electrode 131 and a portion of the insulating layer 140.

The first terminal electrode 133 may cover the first vertical portion 142, portions of the first connection portion 131a, not covered by the first vertical portion 142, and the first band portion 131b formed on the second, fifth and sixth surfaces 2, 5 and 6 of the capacitor body 110, and may cover a portion of the horizontal portion 141 formed on the first band portion 131b.

The second terminal electrode 134 may be disposed to cover externally exposed portions of the second external electrode 132 and a portion of the insulating layer 140.

The second terminal electrode 134 may cover the second vertical portion 143, portions of the second connection portion 132a, not covered by the second vertical portion 143, and the second band portion 132b formed on the second, fifth and sixth surfaces 2, 5 and 6 of the capacitor body 110, and may cover a portion of the horizontal portion 141 formed on the second band portion 132b.

Figure 7:
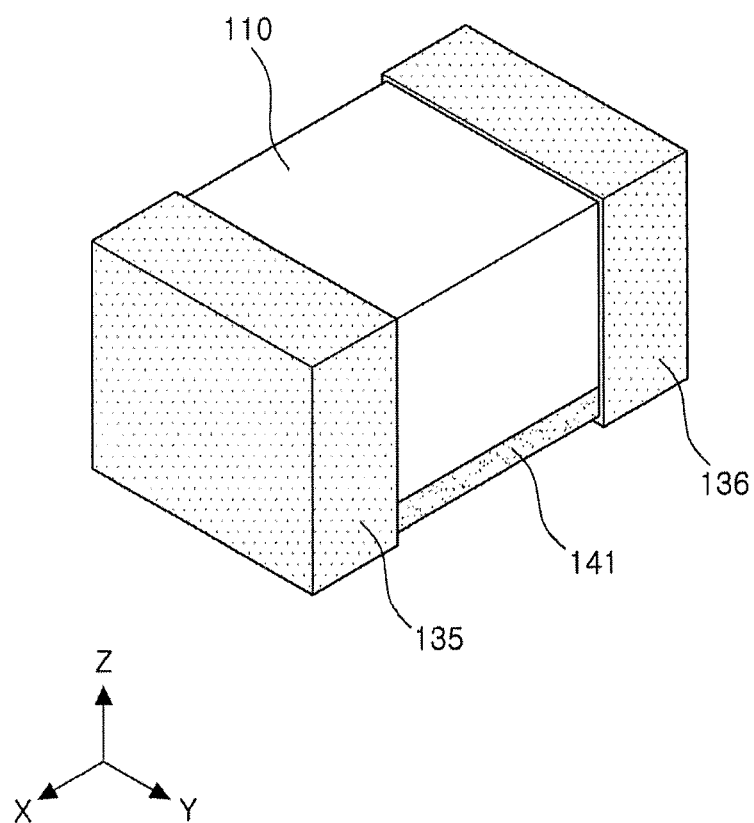
FIG. 7 is a perspective view illustrating a plating layer further disposed in the insulating layer FIG. 5.

As illustrated in FIG. 7, the multilayer capacitor 100 according to exemplary embodiments may further include plating layers 135 and 136 formed on the first and second terminal electrodes 133 and 134.

In this case, the plating layers 135 and 136 may have a structure in which a nickel (Ni) plating layer and a tin (Sn) plating layer are sequentially laminated.

Variation Example

Figure 8:
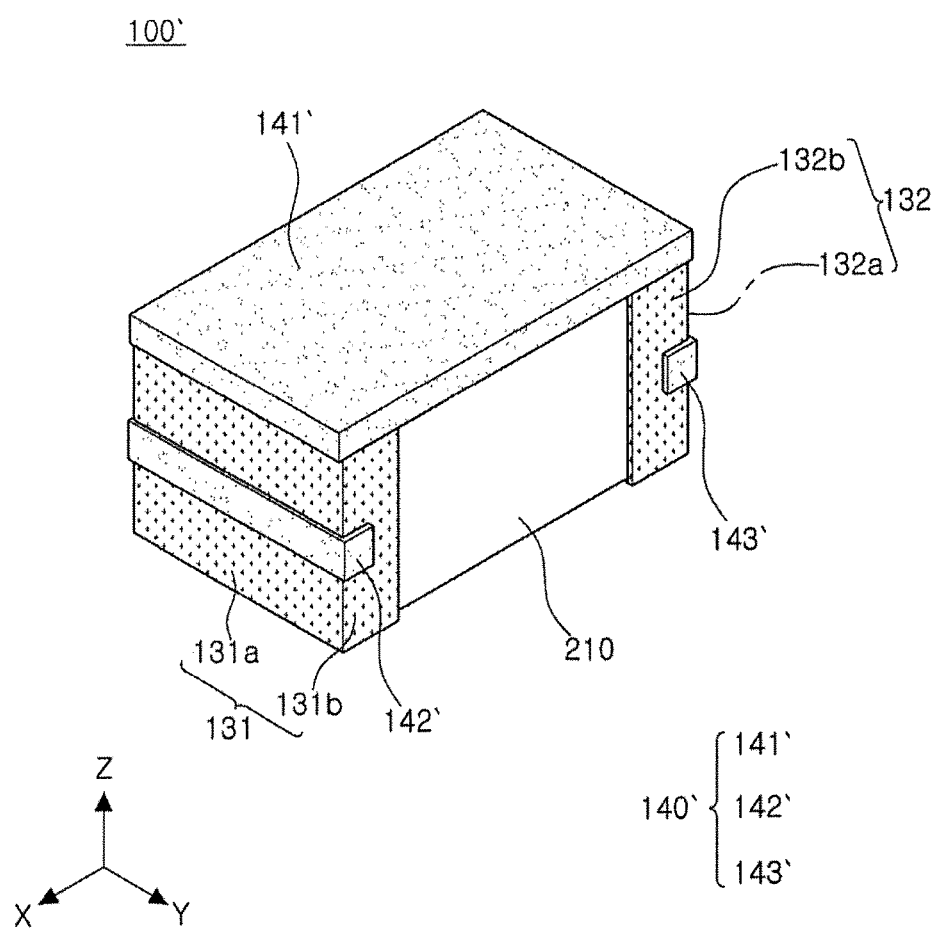
FIG. 8 is a perspective view illustrating another example of an insulating layer disposed on a capacitor body of a multilayer capacitor according to exemplary embodiments in the present disclosure.

FIG. 8 is a perspective view illustrating another example of an insulating layer disposed on a capacitor body of a multilayer capacitor according to exemplary embodiments of the present disclosure.

In this case, since the structures of a dielectric layer 111, first and second internal electrodes 121 and 122, a capacitor body 110 and first and second terminal electrodes 133 and 134 are similar to those in the foregoing exemplary embodiment, detailed descriptions thereof will be omitted to avoid overlapped descriptions.

With reference to FIG. 8, an insulating layer 140' of a multilayer capacitor 100' according to exemplary embodiments may include a horizontal portion 141', a first vertical portion 142' disposed on a third surface 3 of the capacitor body 110 to cover a portion of a first connection portion 131a, and a second vertical portion 143' disposed on a fourth surface 4 of the capacitor body 110 to cover a portion of a second connection portion 132a.

The horizontal portion 141' may be disposed to cover first and second band portions 131b and 132b on a first surface 1 of the capacitor body 110.

In this case, the horizontal portion 141' may be formed on the entirety of the first surface 1 of the capacitor body 110.

The first vertical portion 142' may be spaced apart from the horizontal portion 141', and may be formed lengthwise in a Y direction to be located on a middle portion of the first connection portion 131a in a Z direction, in such a manner that exposed portions may be provided on both sides of the first vertical portion 142' in the Z direction to thus expose portions of the first connection portion 131a.

In this case, both ends of the first vertical portion 142' may extend to portions of the first band portion 131b of the first external electrode 131, formed on fifth and sixth surfaces of the capacitor body 110.

The second vertical portion 143' may be spaced apart from the horizontal portion 141', and may be formed lengthwise in the Y direction to be located on a middle portion of the second connection portion 132a in the Z direction, in such a manner that exposed portions may be provided on both sides of the second vertical portion 143' in the Z direction to thus expose portions of the second connection portion 132a.

In this case, both ends of the second vertical portion 143' may extend to portions of the second band portion 132b of the second external electrode 133, formed on the fifth and sixth surfaces.

Board Having Multilayer Capacitor Mounted Thereon

Figure 9:
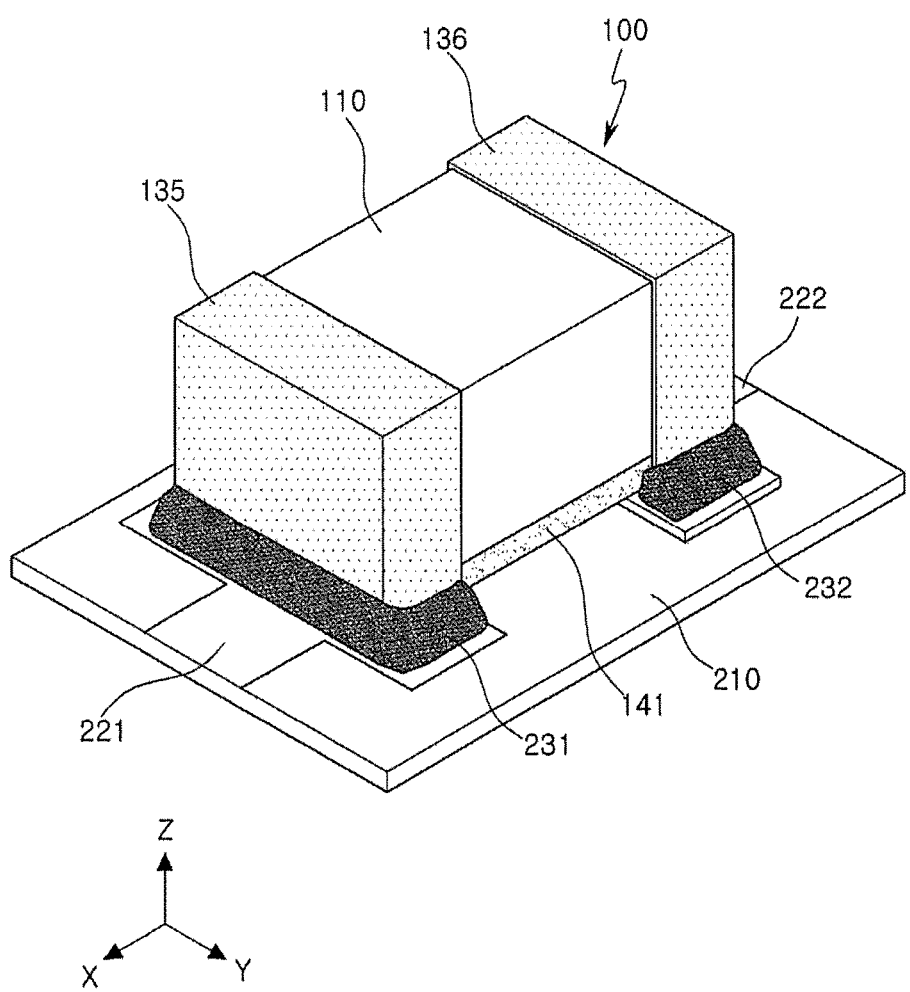
FIG. 9 is a perspective view illustrating a state in which the multilayer capacitor of FIG. 7 is mounted on a substrate.

With reference to FIG. 9, according to exemplary embodiments of the present disclosure, a board having a multilayer capacitor mounted thereon may include a substrate 210 on which a multilayer capacitor 100 according to the first embodiment is mounted, and first and second electrode pads 221 and 222 spaced apart from each other in an X direction on the substrate 210.

In the case of the multilayer capacitor 100, plating layers 135 and 136 formed on first and second terminal electrodes 133 and 134 may be fixed to the first and second electrode pads 221 and 222 by solders 231 and 232 in a state in which the plating layers 135 and 136 formed on the first and second terminal electrodes 133 and 134 are in contact with the first and second electrode pads 221 and 222, respectively, and thus, the multilayer capacitor 100 may be electrically connected to the substrate 210.

Although not illustrated in the drawings, the multilayer capacitor of FIG. 8 may also be mounted on a substrate in a structure similar thereto.

Figure 10:
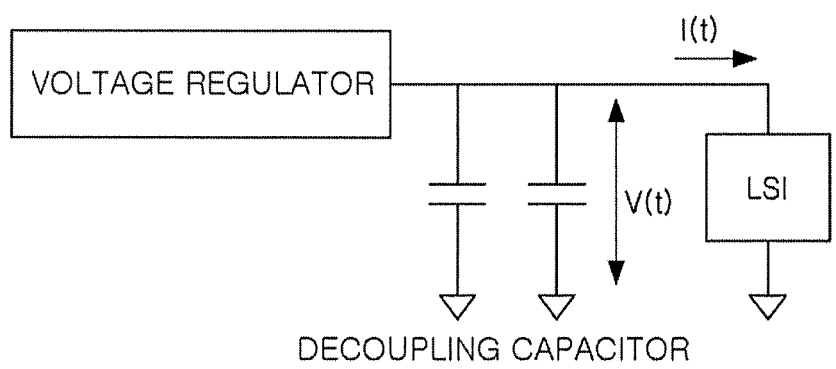
FIG. 10 is a circuit diagram illustrating exemplary embodiments of the present disclosure in which a multilayer capacitor of embodiments of the present disclosure are used as a decoupling capacitor of a power supply circuit of a large scale integration (LSI)
Figure 11:
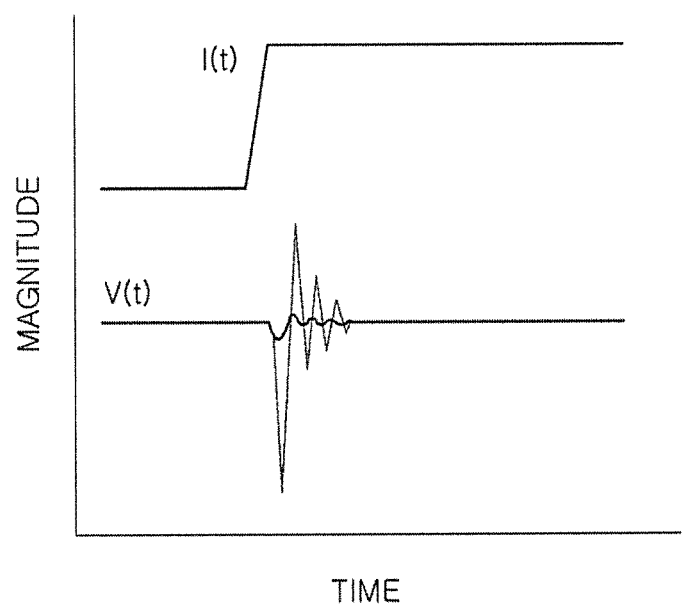
FIG. 11 is a graph illustrating a change in current and a change in voltage in the power supply circuit of FIG. 10.

FIG. 10 is a circuit diagram illustrating an exemplary embodiment of the present disclosure in which a multilayer capacitor is used as a decoupling capacitor of a power supply circuit of LSI. FIG. 11 is a graph illustrating a change (I(t)) in current and a change (V(t)) in voltage in the power supply circuit of FIG. 10.

With reference to FIGS. 10 and 11, a plurality of decoupling capacitors disposed between a voltage regulator and the LSI may absorb a sudden and large change in current flowing in the LSI and a voltage variation caused by wiring inductance, thereby stabilizing a voltage.

In this case, a possibility that antiresonance may occur between capacitors and impedance may be increased may be present.

However, for example, when a multilayer capacitor according to the exemplary embodiment is used as a decoupling capacitor used in an LSI power supply circuit, a current path may be reduced by a terminal electrode formed on a mounting surface of a capacitor body, and thus, ESL may be reduced.

Thus, the current change, and voltage variations caused by wiring inductance, may be absorbed, thereby significantly reducing power impedance.

In addition, the stability of a system against LSI power noise may be significantly improved.

As set forth above, according to exemplary embodiments of the present disclosure, piezoelectric vibrations may be absorbed by elastic force of an insulating layer, and thus, acoustic noise may be reduced.

While exemplary embodiments have been shown and described above, it will be apparent to those skilled in the art that modifications and variations could be made without departing from the scope of the present disclosure as defined by the appended claims.

What is claimed is:

1. A multilayer capacitor, comprising:
   a capacitor body including a dielectric layer and a plurality of first and second internal electrodes alternately disposed therein, the dielectric layer being interposed between the first and second internal electrodes, the capacitor body having a first surface and a second surface opposing each other, the capacitor body having a third surface and a fourth surface connected to the first surface and the second surface and opposing each other, and the capacitor body having a fifth surface and a sixth surface each connected to the first surface and the second surface, the fifth surface and the sixth surface each connected to the third surface and the fourth surface, and the fifth surface and the sixth surface opposing each other, the plurality of first and second internal electrodes being exposed through at least the third surface and the fourth surface, respectively;
   a first external electrode and a second external electrode including first and second connection portions disposed on the third surface and the fourth surface of the capacitor body, and first and second band portions extended from the first and second connection portions to portions of the first surface and the second surface of the capacitor body and portions of the fifth surface and the sixth surface of the capacitor body, respectively;
   an insulating layer covering the first and second band portions on the first surface of the capacitor body and covering portions of the first and second connection portions; and
   a first terminal electrode and a second terminal electrode covering the first and second external electrodes, and portions of the insulating layer disposed on the first surface of the capacitor body and spaced apart from each other.

2. The multilayer capacitor of claim 1, wherein an area of each of the portions of the insulating layer, disposed on the first and second connection portions, is less than an area of each of the first and second connection portions.

3. The multilayer capacitor of claim 1, further comprising a plating layer disposed on the first and second terminal electrodes.

4. The multilayer capacitor of claim 1, wherein the dielectric layer and the plurality of first and second internal electrodes are laminated in a direction perpendicular to a mounting surface.

5. The multilayer capacitor of claim 1, wherein the first surface of the capacitor body is a mounting surface.

6. The multilayer capacitor of claim 1, wherein the insulating layer is disposed on the first and second connection portions in such a manner that the insulating layer connects edges of the first surface and the second surface of the capacitor body to each other, and exposed portions are provided on both sides of the insulating layer in a direction in which the fifth surface and the sixth surface of the capacitor body are connected to each other.

7. The multilayer capacitor of claim 1, wherein the insulating layer is disposed on the first and second connection portions and is extended to portions of the first and second band portions disposed on the fifth surface and the sixth surface of the capacitor body, and exposed portions are provided on both sides of the insulating layer in a direction in which the first surface and the second surface of the capacitor body are connected to each other.

8. A board having a multilayer capacitor mounted thereon, the board comprising:
   a substrate on which first and second electrode pads are spaced apart from each other; and
   the multilayer capacitor of claim 1, of which the first and second terminal electrodes are connected to the first and second electrode pads, respectively, the multilayer capacitor being mounted on the substrate.

* * * * *